United States Patent [19]

Lee

[11] Patent Number: 4,469,774
[45] Date of Patent: Sep. 4, 1984

[54] POSITIVE-WORKING PHOTOSENSITIVE BENZOIN ESTERS

[75] Inventor: Ross A. Lee, Webster, N.Y.

[73] Assignee: E. I. Du Pont de Nemours and Company, Wilmington, Del.

[21] Appl. No.: 479,493

[22] Filed: Mar. 28, 1983

[51] Int. Cl.$^3$ ............................................. G03C 1/78
[52] U.S. Cl. ................................... 430/270; 430/271; 430/296; 430/326; 430/905; 526/328; 526/329; 526/329.3; 526/329.6; 204/159.22
[58] Field of Search ............... 430/270, 296, 326, 905, 430/271; 204/159.22; 526/328, 329, 329.3, 329.6

[56] References Cited

U.S. PATENT DOCUMENTS 3,849,137 11/1974 Barzynski et al. ................ 96/36.2

FOREIGN PATENT DOCUMENTS 4144766 7/1966 Japan .

OTHER PUBLICATIONS

Sheehan et al. The Photolysis of Methoxy–Substituted Benzoin Esters. A Photosensitive Protecting Group For Carboxylic Acids, J. Am. Chem. Soc. 93, 7222, 1971.

*Primary Examiner*—Jack P. Brammer

[57] ABSTRACT

Photosensitive polymeric esters of alkoxybenzoin as defined which upon exposure become soluble in alkaline developers. The positive-working polymeric compounds are used as contact litho films, lithographic and relief printing plates and photoresists.

17 Claims, No Drawings

POSITIVE-WORKING PHOTOSENSITIVE BENZOIN ESTERS

DESCRIPTION

1. Technical Field

This invention relates to new photosensitive compounds. More particularly this invention relates to new photosensitive compounds which are positive-working photosensitive compounds of polymeric benzoin esters and elements containing said compounds.

2. Background Art

Positive-working compounds for use in the preparation of lithographic and other type printing plates and photoresists are known. These compounds upon imagewise exposure become soluble in solvents in the exposed image areas. The unexposed areas remain insoluble in the particular solvent used. J. Kosar, Light Sensitive Systems, John Wiley and Sons, New York, 1967 lists numerous positive-working compounds. Some examples of positive-working compounds are diazonium salts, o-quinone diazide compounds, etc.

The aforementioned positive-working compounds have the disadvantage that they exhibit poor storage stability and thermostability. Diazonium and diazide groups, for example, readily decompose at elevated temperature or after long periods at room temperature.

There is a need for positive-working polymeric photosensitive compounds which are substantially unaffected by heat and consequently are storage stable.

DISCLOSURE OF THE INVENTION

In accordance with this invention there is provided a photosensitive polymer consisting essentially of repeating units A, B and C wherein A is

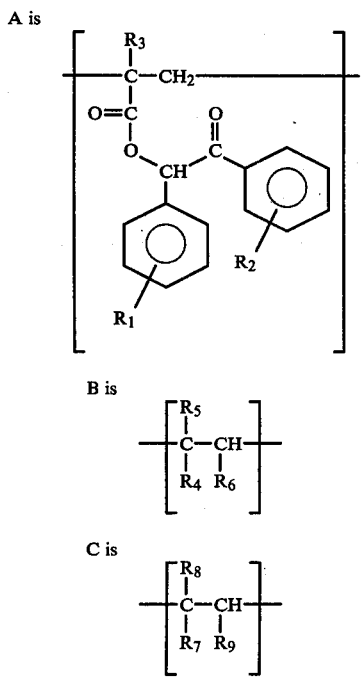

B is $$\left[ \begin{array}{c} R_5 \\ | \\ -C-CH- \\ | \quad | \\ R_4 \; R_6 \end{array} \right]$$

C is $$\left[ \begin{array}{c} R_8 \\ | \\ -C-CH- \\ | \quad | \\ R_7 \; R_9 \end{array} \right]$$

in the proportion mA, nB and pC
wherein m, n and p are the average integral frequencies of their respective monomeric constituents and have values in the range of 1 to 800, 0 to 800 and 0 to 800, respectively, with the proviso that the total on m, n and p ranges from 2 to 1600;

$R_1$ is 3'-methoxy, 3',4'-dimethoxy or 3',5'-dimethoxy;

$R_2$ is 3-methoxy, 3,4-dimethoxy, 3,4-benzo or hydrogen;

$R_3$ is hydrogen or methyl;

$R_4$ is COOH, $SO_3H$, omega carboxyalkyl of 1 to 4 carbon atoms or carboethoxy monophthalate, β-sulfocarboethoxy;

$R_5$ is hydrogen or methyl;

$R_6$ is hydrogen, methyl or COOH;

$R_7$ is —CN, —$COOR_{10}$ where $R_{10}$ is alkyl of 1 to 10 carbon atoms, β-hydroxy alkyl where alkyl is of 1 to 4 carbon atoms;

$R_8$ is hydrogen or methyl;

$R_9$ is hydrogen or methyl.

The photosensitive polymeric compounds can be used to prepare positive-working photosensitive elements which comprise a support bearing a photosensitive layer consisting essentially of at least one of said polymeric compounds defined above and optionally other additives described below. The positive-working photosensitive elements and their method of preparation and use will be described more fully below.

The photosensitive polymeric compounds of this invention are prepared by the procedures illustrated in the examples below. The molecular weights for the polymeric compounds illustrated in the examples are expressed in terms of weight average molecular weights (Mw) and number average molecular weights (Mn). Weight average molecular weights and number average molecular weights are determined by gel permeation chromatography procedures employing a polymeric standard as is known to those skilled in the art. The standard used is a polymer that is as close as possible to the structure of the compound being determined.

The special characteristic of the polymeric compound of the invention is the methoxybenzoin (3'-; 3',4'-; or 3',5'-) group of the polymer. The compound is photosensitive per se without the presence of other photosensitive groups. The precursors of a polymeric compound, e.g., poly(3',5'-dimethoxybenzoinacrylate), are set forth in Example 1 below. For example, 2-phenyl-1,3-dithiane is prepared as described by Seebach et al., J. Org. Chem. 31, 4303 (1966). This compound is then used to prepare 2-[1-hydroxy-1-(3,5-dimethoxyphenyl)-]methyl-2-phenyl-1,3-dithiane by the general procedure described by Seebach et al., J. Org. Chem. 40, 231 (1975). 3',5'-dimethoxybenzoin is subsequently prepared by thioketal hydrolysis according to the general procedure described by Naraska et al., Bull. Chem. Soc. Japan (Tokyo), 45, 3724 (1972). This compound is esterified to 3',5'-dimethoxybenzoin acrylate by known esterification procedures using acryloyl chloride and then is polymerized in a known way to form a polymer of the invention. An alternative procedure for preparing a substituted benzoin acrylate monomer illustrated in Example 3 is as follows: an aldehyde, e.g., β-naphthaldehyde and a dithiol, e.g., 1,3-propanedithiol, are reacted in a solvent, e.g., chloroform saturated with HCl, to form 2-β-naphthyl-1,3-dithiane. To the isolated product in anhydrous tetrahydrofuran is added n-butyllithium/hexane at dry ice/acetone temperature. Subsequently 3,5-dimethoxybenzaldehyde in the same solvent is added and stirred followed 30 minutes later by acryloyl chloride in solvent to form 3,4-benzo-3',5'-dimethoxybenzoin acrylate thioketal. Hydrolysis of the thioketal as described above produces 3,4-benzo-3',5'-dimethoxybenzoin acrylate. It is recognized that analogues of the above compounds can be prepared by the foregoing procedures. The proportions of the various repeating units in the final copolymer can be controlled by controlling the quantities of reactants present during copolymerization.

The monomers used in the invention, including those illustrated above, can be polymerized to homopolymers or copolymerized with one or two monomers by the procedure as defined above. Monomers suitable for this copolymerization include: acrylic acid, 2-acryloxyethylphthalate, acrylonitrile, hydroxyethyl methacrylate, vinyl acetate, vinyl methyl ether, styrene, maleic anhydride, sulfonic acid, e.g., β-sulfoethyl acrylate, AMPS® (a sulfonic acid manufactured by Lubrizol Corp., Wickliffe, Ohio), etc. The choice of monomers will vary depending on the end use for the polymer, e.g., whether present in printing plate, photoresist or litho film. Photo speed is greatly enhanced by using monomers containing alkali soluble groups, e.g., acrylic acid, 2-acryloxyethylphthalate, to bias polymer solubility so that only a small amount of photochemical cleavage is required to render the exposed image areas soluble or removable in alkaline developers. Copolymers can be characterized based on the mole ratio of the starting monomers. Thus in Table 2 below the mole ratio m:n:p refers to the mole ratio of starting monomers. In the event p is 0 the proportion of m to n may be expressed as n/m as in Table 1 or n/m as in the claims below.

The photosensitive compounds of this invention can be used in positive-working coating compositions. If desired, dyes or pigments, plasticizers, sensitizers, cobinders and other additives can be present with the photosensitive compounds. Suitable soluble dyes include: CI 109 red dye, triaryl methane dyes like Victoria Blue B Base; anthraquinone dyes like Sevron® Blue 2G; thiazine dyes like methylene blue A; a complex of the azo dye C.I. Acid Yellow No. 99 and C.I. Basic Violet No. 10.; aniline blue black, etc.

Useful optional plasticizers can also be present in the photosensitive composition in an amount from 0 to 25% by weight of the total weight thereof. Useful plasticizers include: triethylene glycol diacetate, tricresyl phosphate and other known triaryl- and trialkyl-phosphates, dibutyl and dioctyl phthalates, dibutyl adipate, 2-butoxyethanol, ethylene glycol monobutyl ether, ethylene glycol dibutyrate, esters of $C_4$ to $C_{10}$ fatty acids with multivalent alcohols, e.g., diethylene and triethylene glycols, glycerol, and polyethylene oxides and their alkyl ethers, nonylphenoxy poly(ethyleneoxy)ethanol, N-ethyl-p-toluenesulfonamide, etc.

Optional sensitizers which improve the photosensitivity of the composition particularly the sensitivity in certain wavelength ranges may be present therein in an amount from 0 to 20% by weight thereof. Xanthone and substituted xanthone compounds are preferred.

Optionally the photosensitive compositions can contain a polymeric binder in an amount from 0 to 80% by weight of the composition. One such binder is a polyepoxide resin in an amount up to about 10% by weight based on the total weight of the photosensitive composition. Additional optional binders include: polyacrylates, polymethacrylates, polyvinyl alkyl ethers, phenol/formaldehyde resins, etc.

To produce printing plates and contact lithographic films one or more photosensitive compounds of the invention together with appropriate additives and suitable organic solvents are applied by conventional methods such as casting, dipping, spraying and whirling to a dimensionally stable rigid or flexible support which advantageously has a hydrophilic surface. Suitable solvents include: dioxane, tetrahydrofuran, acetone, toluene, methylene chloride, N-methyl pyrollidone, etc. The dry thickness of the layer formed is 0.0001 to 0.100 inch (0.0025 to 2.54 mm), preferably 0.0001 to 0.010 inch (0.0025 to 0.25 mm), and most preferably 0.0001 to 0.0005 inch (0.0025 to 0.013 mm). Suitable supports include: aluminum sheet, e.g., anodized, zinc, copper, chromium; glass; polymeric films, e.g., polyethylene terephthalate, regenerated cellulose, cellulose acetate, vinyl polymers and copolymers, e.g., polyalkyl acrylates; cardboard, cloth, parchment, polyethylene and polypropylene coated papers and polyamides like nylon. Supports especially useful to make printing plates, particularly for lithographic printing, include supports made of anodized aluminum, grained aluminum copper and zinc. The support can be pretreated, e.g., precoated before applying radiation-sensitive coating, with known subbing layers such as gelatin, polyacrylamide, and copolymers of vinylidene chloride and acrylic monomers. The support can also have a filter or anti-halation layer to eliminate unwanted reflection from the support.

The dry element is subsequently exposed through an image bearing transparency in a conventional exposure device for about 0.5 to 60, preferably 0.5 to 10, minutes. The exposure time depends on the power of the actinic radiation source, the distance of the element from the source and the composition of photosensitive layer. The actinic radiation source should exhibit a wavelength of from 2000 to 6000 Å. Xenon lamps, high-pressure mercury vapor lamps, carbon arc lamps, black light blue photopolymer lamps etc. are useful.

Following imagewise exposure the exposed image areas can be washed out with alkaline developers. The pH values of the developers are generally higher than 7.5. The proper pH value can be determined easily by experiment. Useful developers and developer mixtures include: $Na_2CO_3/NH_4Cl$, e.g., 8% and 0.3%, 5% and 1%, respectively; $NaHPO_4$ (7.5 pH); $Na_2CO_3/NaHCO_3$(9/1), e.g., 3% aqueous solution; 0.2 g NaOH, 30 ml 2-propanol, 10 ml triethanolamine and 60 ml water; water/butylcarbitol/glycol/triethanolamine/NaOH solution described in Example 3C and 4C below, water-/alcohol/triethanolamine/NaOH solution, e.g., 60 ml, 30 ml (2-propanol), 10 ml and 0.2 g, respectively, 5% or more aqueous sodium carbonate, 0.5% or more sodium hydroxide, 10% diethyleneglycol monobutylether and water, etc.

To produce photoresists either the dry layer described above or a photosensitive compound of the invention in suitable solvents as described above is applied by a conventional method to a substrate to be etched, e.g., a clean, degreased copper coated printed circuit board. The dry thickness of the resist layer is about 0.0003 to about 0.01 inch (ca. 0.0008 mm to ca. 0.25 mm) or more. After exposure through the image of a printed circuit, for example, and washout with aqueous alkali or other suitable developer, the uncovered areas of the copper layer can be etched away, e.g., with $FeCl_3$, nitric acid, etc. The nonetched areas of the copper layer can then be uncovered by treatment with a solvent.

A preferred mode is illustrated in Example 4 wherein the polymeric compound is copoly(3',4'-dimethyoxybenzoin acrylate, 2-acryloxyethyl phthalate).

INDUSTRIAL APPLICABILITY

The polymeric esters of alkoxybenzoin become alkaline soluble on imagewise exposure to actinic radiation yielding positive images after development. In dry layer form on a suitable support the polymeric compounds can be used as contact lithographic films and printing plates, relief printing plates and photoresists. The photosensitive elements possess good heat stability and storage properties.

EXAMPLES

The invention is illustrated by the following examples wherein parts and percentages are by weight unless indicated otherwise.

EXAMPLE 1

This example illustrates the synthesis of 3',5'-dimethoxybenzoin acrylate, a benzoin ester precursor of polymers of the invention, and homopolymerization and copolymerization products thereof and the use of the polymeric compounds of the invention in photoimaging elements.

A. Synthesis of 3',5'-Dimethoxybenzoin Acrylate (1) 2-phenyl-1,3-dithiane (Seebach et al., J. Org. Chem., 31, 4303 (1966)

Dry HCl was bubbled into a solution of 1,3-propanethiol (40.0 ml, 0.395 mole) and benzaldehyde (40.0 ml, 0.393 mole) in 300 ml of ice-cooled chloroform until saturation was achieved (5 minutes). The mixture was stirred at room temperature for 30 minutes, and the chloroform solution was washed twice with 100 ml water, three times with 100 ml 10% aqueous KOH, twice with 100 ml water, and dried over anhydrous $Na_2SO_4$. The mixture was filtered and the chloroform removed by evaporation to yield a white crystalline solid. Recrystallization of the solid from 200 ml methanol yielded: 61 g (77%) of white crystals, m.p. 72°–73° C.

(2)
2-[1-hydroxy-1-(3,5-dimethoxyphenyl)]methyl-2-phenyl-1,3-dithiane.

18 ml of 2.035 molar n-butyl lithium/hexane (36.4 mmoles) was added to a stirred solution of 7.1 g 2-phenyl-1,3-dithiane (36.2 mmoles) in 73 ml dry tetrahydrofuran (distilled from sodium benzophenone ketyl) under nitrogen, cooled in a dry ice/acetone bath, and stirred cold for one hour. A solution of 6.0 g of 3,5-dimethoxybenzaldehyde (36.2 mmoles) in 10 ml dry tetrahydrofuran was then added. The resulting solution was warmed to room temperature and poured into 300 ml water. Methylene chloride was added and the aqueous solution extracted with three portions, 100 ml each, of methylene chloride, and the combined extracts washed with 100 ml water, 100 ml 7% aqueous NaOH, 100 ml $H_2O$, and dried over anhydrous $K_2CO_3$. Filtering and evaporating the solvent gave an oil whose infrared and NMR spectra showed that the above thioketal was the main component of the crude oil.

(3) 3',5'-Dimethoxybenzoin 9.4 g of crude compound prepared in (2) above mixed with 8.5 g cupric chloride and 4.0 g cupric oxide in 300 ml of 99% aqueous acetone was refluxed for 75 minutes and then stirred overnight at room temperature. Acetone was added, the mixture filtered, the solid washed with acetone and the combined acetone solution evaporated under vacuum. The residue was taken up in benzene, water added, insoluble material filtered off, and the benzene solution washed three times with 100 ml water, once with 100 ml saturated aqueous $Na_2SO_4$ and dried over anhydrous $Na_2SO_4$. The solvent was filtered and stripped off to yield an oil that crystallized after washing with hexane. About 1.5 g (>21%) of 3',5'-dimethoxybenzoin was obtained with mp 98°–104° C.

(4) 3',5'-Dimethoxybenzoin Acrylate

To an ice cooled solution of 0.8 g (2.94 mmoles) of 3',5'-dimethoxybenzoin prepared in (3) above and 1.13 ml dimethylaniline in 10 ml methylene chloride, under nitrogen, was slowly added a solution of 1.5 ml (18 mmoles) acryloyl chloride in 10 ml of mehtylene chloride. After the addition was complete, the mixture was stirred overnight at room temperature, diluted with methylene chloride, washed twice with 75 ml 5% aqueous HCl, once with 100 ml $H_2O$, once with 100 ml 5% aqueous $NaHCO_3$, once with 100 ml $H_2O$, once with 100 ml saturated $Na_2SO_4$ and dried over anhydrous $Na_2SO_4$. The solvent was filtered and stripped off to yield an oil that crystallized to give 0.6 g (63%) of compound. Recrystalization from benzene/hexane (1/1) gave colorless crystals, mp 88°–89° C. Infrared, NMR, and mass spectrometric analyses showed that the above compound was obtained.

B. Synthesis of Poly(3',5'-dimethoxybenzoin acrylate)

A mixture of 200 mg (0.6 mmole) of 3',5'-dimethoxybenzoin acrylate prepared in A (4) above, 0.5 mg azobisisobutyronitrile in 2.5 ml nitrogen purged dioxane was heated to 65° C. for 9.5 hours under nitrogen. After standing overnight at room temperature, the mixture was poured into about 50 ml petroleum ether and a white polymer was collected. The yield was 150 mg (~75%). The infrared spectrum showed that the above polymer was obtained.

C. Synthesis of Copoly(3',5'-dimethoxybenzoin acrylate/acrylic acid)

A mixture of 320 mg acrylic acid, 1.6 g of 3',5'-dimethoxybenzoin acrylate prepared in A(4) above, and 20.0 mg of azobisisobutyronitrile in 20 ml nitrogen-purged dioxane was heated at 65° C. for six hours under nitrogen, stirred overnight at room temperature, and poured into 400 ml petroleum ether, yielding 1.85 g of copolymer having the infrared spectrum of the above copolymer. The ratio of n/m is 0.9. Additional values for n/m set forth below in Table 1 are obtained by changing the ratio of the monomers.

D. Synthesis of Copoly(3',5'-dimethoxybenzoin acrylate/2-acryloxyethylphthalate)

To a mixture of 3',5'-dimethoxybenzoin acrylate (5.0 g, 15 mmoles) and 2-acryloxyethylphthalate (1.6 g, 6 mmoles) in 60 ml of nitrogen-purged dioxane was added 66 mg azobisisobutyronitrile. The mixture was heated at 80° C. for six hours, cooled to room temperature and poured into 500 ml petroleum ether. The copolymer was collected, washed with petroleum ether, and dried yielding 6.6 g of the above copolymer. The ratio of n/m is 0.4. Additional values for n/m set forth below in Table 1 are obtained by changing the ratio of the monomers.

E. Formation of Positive Image (1) A coating solution containing 11.0% of the polymer prepared as described in Example 1B, 1% triethylene glycol diacetate, and 88% acetone was knife-coated onto a 0.001 inch (0.0025 cm) polyethylene terephthalate support to form a dry photosensitive film. The resulting element was exposed for 2 minutes through an image-bearing transparency to a bank of BLB ( black light blue) fluorescent lamps (Sylvania 18T8-BLB-40-180°) 2 inches (5.08 cm) from a pressure held frame and was developed 2 minutes in aqueous $Na_2CO_3$ (8%)/$NH_4Cl$ (0.3%) to give a positive washout image.

(2) Example 1E(1) was repeated using a copolymer prepared as described in Example 1 C except that 50 ml copolymer was dissolved in 0.1 ml 6% tricresylphosphate/acetone and coated with 0.005 inch (0.127 mm) doctor knife. The element was exposed for 2 minutes in a black light blue exposure source described in Example 1E(1) and developed for 10 minutes in 3% aqueous 9:1 $Na_2CO_3/NaHCO_3$ containing 6% $NH_4Cl$. The element gave a good positive washout image.

F. Single Exposure Positive Contact Litho Film Pigmented Coating

A coating solution of the following composition was prepared by overnight roller mill mixing of the following ingredients:

| Ingredients | Amount |
| --- | --- |
| Methylene chloride | 13.0 ml |
| Ethyl Cellosolve | 2.0 ml |
| Tricresylphosphate | 0.4 g |
| Carbon black (50)/ethyl acrylate (56)/ methyl methacrylate (37)/acrylic acid (7) terpolymer, acid no. 60–65, Mw 7000, 20% aqueous | 2.5 g |

The coating solution was applied to the resin-subbed side of 0.004 inch (0.01 cm) polyethylene terephthalate film employing a 0.003 inch (0.076 mm) doctor knife. An air-dried coating 0.0002 inch (5.1 μm) in thickness was obtained having an optical density of 3.8-4.0.

Photosensitive Coating

A coating solution of 0.2 g of the copolymer prepared as described in Example 1D but from equimolar proportions of the two co-monomers and dissolved in 1 ml of methylene chloride containing 30 mg of tricresylphosphate was applied to the pigmented surface employing a 0.002 inch (0.005 cm) doctor knife and dried with a hot air gun.

Exposure and Processing

The film element was exposed for 1 minute to a high-pressure mercury arc through a 150 line screen target and gave good dot rendition for 10-95% dots when developed 30 seconds in 3% aqueous $Na_2CO_3/NaHCO_3(9/1)$.

Alternate Procedure For Preparation, Exposure and Processing Single Exposure Positive Contact Litho Film To the surface of the film containing carbon black in its coating described above is laminated a photosensitive layer prepared by coating the above-described photosensitive coating on the surface of a polyethylene terephthalate film 0.001 inch (0.025 mm) thick. The laminate is formed by passing the two coated films between 2 rollers and stripping off the polyethylene terephthalate film from the photosensitive layer. The photosensitive coating is exposed for 3 minutes using the BLB radiation source described in Example 1E(1) and is developed for 90 seconds with a solution containing 5% $NaCO_3$ and 1% $NH_4Cl$. An excellent positive image is obtained.

G. Positive Photoresist for Printed Circuit

A solution of 50 mg of the copolymer prepared as described in Example 1C and 5 mg triethylene glycol diacetate in 0.1 ml acetone was applied to a copper clad circuit board with a 0.005 inch (0.012 cm) doctor knife and dried. After a 4 minute exposure through a mask using a black light blue exposure source described in Example 1E(1) and development in 3% aqueous $Na_2CO_3/NaHCO_3(9/1)$, a positive resist image was obtained. The copper in the exposed areas was etched was etched with 20% aqueous $FeCl_3$ solution at 90° F. (26° C.). After washing with 100 ml water followed by 100 ml of acetone, a positive copper image remained on the circuit board.

H. Offset Litho Plate

A solution of 1.6 g of the copolymer prepared as described in Example 1D; C.I. 109 red dye, 24 mg, in 8 ml of N-methyl pyrollidone, was applied to a silicate-subbed aluminum plate surface by whirl coating. A good positive image with 98% and 2%, 150 line screen, dot rendition was obtained after a 500 unit exposure to a 2000 watt mercury lamp at a distance of 38 inches (96.5 cm) using an "Ascor" Light Integrator Platemaker Model 1415-12 with a Berkey "Ascor" 1601-40 light source and 10 seconds development in the following developer:

| Ingredients | Amount (% Vol.) |
| --- | --- |
| 2-Propanol | 4 |
| Propylene glycol | 15 |
| Triethanolamine | 2 |
| Diethylene glycol monobutyl ether | 16 |
| NaOH | 1% by wt |
| Water | 62 |

The printing plate was tested on an Addressograph offset printing press and gave excellent prints after 4000 impressions with non-abrasive ink followed by 5000 impressions with abrasive ink for a total of 9000 impressions.

EXAMPLE 2

This Example illustrates the use of various 3',5'-dimethoxybenzoin copolymers in single exposure positive contact litho films. Table 1 below lists the various copolymers prepared as described in Examples 1C or 1D, the exposure using either a 1000-watt instant on Mercury nuArc ® Printer (MNA) 21 inches (53.34 cm) from the vacuum frame or black light blue (BLB) exposure source described in Example 1E(1), and liquid development for the times stated in the given developer. 50 mg of copolymer in 0.2 ml of 30 mg/ml tricresyl phosphate (TCP)/methylene chloride (MeCl$_2$) were used with a 0.002 inch (0.05 mm) doctor knife on the carbon black coating described in Example 1F.

TABLE 1

| Example | Copolymer n/m | Exposure Device (min) | Developer seconds | Comment |
|---|---|---|---|---|
| 1D | 1.5 | MNA (1) | 3% aq. 9:1 Na$_2$CO$_3$/NaHCO$_3$; (10) | complete washout to base |
| 1D | 1.0 | MNA (1) | 3% aq. 9:1 Na$_2$CO$_3$/NaHCO$_3$; (30) | 10-95% dots resolved |
| 1D[1] | 0.75 | BLB (1) | 0.2 g NaOH, 30 ml 2-propanol, 10 ml triethanolamine 60 ml water; (7) | complete washout to base |
| 1D[2] | 0.5 | MNA (1) | 2.0 g NaOH, 30 ml 2-propanol, 10 ml triethanolamine 60 ml water; (50) | complete washout to base |
| 1C[2] | 1.13 | MNA (1) | 3% aq. 9:1 Na$_2$CO$_3$/NaHCO$_3$; (45) | film had some cracks; good imaging |
| 1C[3] | 0.9 | BLB (2) | 5% aq. Na$_2$CO$_3$/1% NH$_4$Cl; (60) | complete washout to base |

[1] 50 mg copolymer in 0.2 ml of a solution of 20 mg TCP per 1 ml MeCl$_2$ and solution coated with 0.002 inch (0.051 mm) doctor knife.
[2] 200 mg copolymer in 1 ml of a solution of 30 mg TCP in 1 ml MeCl$_2$ and solution coated with 0.003 inch (0.076 mm) doctor knife
[3] 100 mg copolymer in 0.4 ml of a solution of TCP (15%)/MeCl$_2$ (85%) and solution coated with a 0.003 inch (0.076 mm) doctor knife

EXAMPLE 3

This example illustrates an alternative synthesis for a substituted benzoin acrylate monomer and an alternative aldehyde, β-naphthaldehyde, as the starting material for a dithiane synthesis.

A. Synthesis of 3,4-Benzo-3',5'-dimethoxybenzoin Acrylate Monomer (1) Synthesis of 2-β-naphthyl-1,3-dithiane A solution of 23.4 g (0.15 mole) β-naphthaldehyde, 15 ml (16.2 g, 0.15 mole) 1,3-propanedithiol in 100 ml chloroform at 0° C. was saturated with HCl, allowed to warm to 25° C., stirred 20 minutes, diluted with 200 ml methylene chloride, washed twice with 20 ml water, twice with 20 ml aqueous 10% KOH, once with 20 ml saturated Na$_2$SO$_4$ and dried over MgSO$_4$. The solvent was removed under vacuum, yielding 11.3 g crude solid, which when recrystallized from benzene/hexane (1/1) gave 6.57 g product melting at 109°–110° C. Infrared spectrum showed that the above naphthyl dithiane was obtained.

(2) Synthesis of 3,4-Benzo-3',5'-dimethoxybenzoin Acrylate

To the product prepared in Example 3A(1), 6.5 g (26.4 mmoles) in 35 ml anhydrous tetrahydrofuran under nitrogen at dry ice/trichloroethylene temperature, was added via syringe 16.4 ml (1.6 molar) n-butyllithium/hexane. The mixture was stirred for five minutes, 4.5 g (27 mmoles) 3,5-dimethoxybenzaldehyde in 15 ml anhydrous tetrahydrofuran was added, and the resulting mixture stirred cold for 30 minutes. Acryloyl chloride, 2.4 ml (2.67 g, 29.5 mmoles) in 5 ml anhydrous tetrahydrofuran was then added slowly to the mixture, which was warmed slowly to room temperature, the solvent was removed under vacuum, methylene chloride (50 ml) and water (50 ml) were added, the water layer extracted three times with 50 ml methylene chloride. The combined extracts washed once with 25 ml 5% aqueous NaHCO$_3$, once with 25 ml water and once with 25 ml saturated Na$_2$SO$_4$, and dried over MgSO$_4$. The material was filtered and the solvent removed under vacuum to give a viscous oil. The infrared and NMR spectra showed the expected thioketal acrylate. A mixture of this material, 6.0 g dissolved in 140 ml 98% aqueous acetone with 3.18 g CuO and 6.78 g CuCl$_2$, was refluxed for 90 minutes, allowed to cool and stand over night at room temperature, filtered and the solid rinsed with acetone. After the combined acetone filtrate was evaporated under vacuum, benzene (150 ml) and water (150 ml) were added to the residue, the solids were filtered off and the water layer was extracted three times with 50 ml benzene. The combined benzene extracts were washed four times with 50 ml water, once with 50 ml saturated aqueous Na$_2$SO$_4$, and were dried over MgSO$_4$. The solution was filtered, solvent stripped under vacuum and the resulting oil was triturated with hexane to yield a solid product, m.p. 113°–116° C. having infrared and NMR spectral characteristics anticipated for the above monomer.

B. Synthesis of Copoly(3,4-benzo-3',5'-dimethoxybenzoin acrylate/2-acryloxyethyl phthalate)

This copolymer was prepared by the procedure of Example 1D wherein 1.0 g of the substituted benzoin acrylate prepared as described in Example 3A(2), 0.35 g of 2-acryloxyethyl phthalate, and 14 mg azobisisobutyronitrile yielded 1.2 g of the desired copolymer as determined by infrared mass spectrometric analysis.

C. Positive Washout Imaging

A coating solution of the copolymer prepared in Example 3B, 50 mg; CI 109 red dye, 0.5 mg; and 20 mg/ml of tricresylphosphate/methylene chloride, 0.3 ml, was applied to an anodized aluminum sheet using a 0.002 inch (0.005 cm) doctor knife and air dried. The dry layer was exposed for 2 minutes to a BLB source described in Example 1E(1) through a transparency and was developed for 11 seconds in the following developer solution to give a positive image.

| Ingredients | Amount (g) |
|---|---|
| Water | 885.0 |
| Butylcarbitol | 150.0 |
| Propyleneglycol | 20.0 |
| NaOH | 6.0 |
| Triethanolamine | 20.0 |

EXAMPLE 4

This example illustrates the use of another dimethoxybenzoin acrylate as a photosensitive monomer and xanthone in the coating solution as an optional sensitizer.

A. Synthesis of 3',4'-Dimethoxybenzoin Acrylate

A 500 ml 3-necked flask fitted with a nitrogen source in and out, magnetic stirrer, dropping funnel, and serum cap, was charged with 125 ml anhydrous 1,2-dimethoxyethane and 19.6 g (0.1 mole) 2-phenyl-1,3-dithiane, the mixture cooled to −20° C. and 64 ml (43.6 g) of 1.6 molar n-butyllithium was added. To a solution of 16.6 g 3,4-dimethoxybenzaldehyde (0.1 mole) in 25 ml anhydrous 1,2-dimethoxyethane was added dropwise, 8.1 ml (9.05 g) acryloyl chloride in 25 ml 1,2-dimethoxyethane.

The mixture was allowed to reach room temperature and stirred for 15 minutes, 100 ml 5% aqueous NaHCO$_3$, 100 ml benzene, were added followed by 100 ml water and the two phases were separated, the organic phase being washed once with 100 ml water. The solvent was vacuum evaporated, the residue dissolved in 600 ml 98% aqueous acetone and 19.5 g CuO and 41.8 g CuCl$_2$ were added. The mixture was refluxed for 1.5 hours, cooled to room temperature, the solid filtered off, rinsed with acetone, and the combined acetone rinse vacuum evaporated. The residue was taken up in 300 ml benzene/200 ml water, the layers separated, the water layer extracted three times with 100 ml benzene and the combined benzene extracts were washed four times with 100 ml water, once with 5% aqueous HCl, once with 5% aqueous NaHCO$_3$, once with 100 ml saturated aqueous Na$_2$SO$_4$, dried with 10 g anhydrous MgSO$_4$, filtered, evaporated under vacuum, and triturated with hexane/benzene (1/1) to give 9.43 g (ca 33%) of 3',4'-dimethoxybenzoin acrylate.

B. Synthesis of Copoly(3',4'-dimethoxybenzoin acrylate/2-acryloxyethyl phthalate)

In a 2-necked round bottom flask fitted with nitrogen inlet and reflux condenser, 60 ml dioxane was purged with nitrogen for several minutes, 6.52 g 3',4'-dimethoxybenzoin acrylate, 2.12 g 2-acryloxyethyl phthalate, and 0.076 g azobisisobutyronitrile were added. The mixture was heated to 65° C. solution temperature for six hours, cooled to room temperature and stirred overnight. The mixture was then poured into 500 ml petroleum ether, the liquid decanted, the residue rinsed with petroleum ether and vacuum dried to yield the above copolymer.

C. Preparation of a Litho Plate

A coating solution of the following ingredients was whirl coated on an anodized aluminum sheet at 120-rpm and dried 20 minutes at 100° F.:

| Ingredients | Amount (g) |
| --- | --- |
| Copolymer Example 4B | 1.0 |
| Xanthone | 0.1 |
| CI 109 red dye | 0.03 |
| N—methylpyrrolidone | 7.0 ml |

The resulting element was exposed for 2 minutes through a 30 step 3√2 gray scale transparency to the radiation of a black light blue (BLB) source described in Example 1E(1), and developed 10 seconds in a solution of the following composition diluted ½ with water:

| Ingredients | Amount (%) |
| --- | --- |
| Water | 67.5 |
| Butylcarbitol | 16.0 |
| Propyleneglycol | 15.0 |
| Triethanolamine | 1.0 |
| NaOH | 0.5 |

An excellent positive image was obtained. A similar result was obtained with a 25 unit exposure to the mercury nuArc ® Printer exposure source described in Example 2 and 30 seconds development in the same solution described above. Both exposure and development latitudes were good, and resolution was 2-98% dots on a 150-line screened image.

EXAMPLES 5–12

Various polymeric compounds having the structures set forth in Table 2 were prepared from the designated monomers in the given mole ratios under the polymerization conditions. The compositions were coated on an anodized aluminum sheet (Anocoil ®) to a thickness of about 0.0002 inch (0.005 mm) with the same formulation as described in Example 4C unless otherwise noted. The films were imagewise exposed using the BLB source described in EXAMPLE 1E(1) and developed for the times set forth below. The developer was the same as described in Example 4C unless otherwise noted:

Useful positive image elements were obtained.

| Example | Time of Exposure (sec) | Development (sec) |
| --- | --- | --- |
| 5 | 120 | 10 |
| 6 | 120 | 20[1] |
| 7 | 360 | 15 |
| 8 | 240 | 120[2] |
| 9 | 60 | 10[3] |
| 10 | 120 | 30[3] |
| 11 | 120 | 30[3] |
| 12 | 22 units MNA* | 4[4] |

[1]4C developer to which 2% triethanolamine and 66.5% water was added
[2]4C developer undiluted
[3]Developer formulation is: 0.375% NaOH, 7.5% ethylene glycol monobutyl ether and 92.125% water
[4]Developer formulation is: 60 ml water, 30 ml 2-propanol, 10 ml triethanolamine and 0.2 g NaOH
*22 Units MNA is the number of units exposure on the Mercury nuArc ® Printer described in Example 2.

TABLE 2

| Ex. | Polymeric Compound Structure | Mole Ratio m:n:p | Polymerization Conditions | % Polymer Less than 10,000 Mn | Mn | Mw | Comments |
| --- | --- | --- | --- | --- | --- | --- | --- |
| 5 | ―(CH—CH$_2$)$_m$―(CH—CH$_2$)$_n$― with (A) O=C—O—CH(φ)—C$_6$H$_3$(OCH$_3$)(OCH$_3$) and (B) O=C—O—CH$_2$CH$_2$—O—C(O)—C$_6$H$_4$—CO$_2$H | 71:29:0 | 10% monomers, 0.1% azobisisobutyronitrile in dioxane, N$_2$, 65° C., 6 hrs | 46% | 5,100 | 64,000 | Excellent positive image |
| 6 | Same as Example 5 | 71:29:0 | 20% monomer 0.2% nitrile of | 44% | 4,700 | 33,000 | Excellent positive image |

TABLE 2-continued

| Ex. | Polymeric Compound Structure | Mole Ratio m:n:p | Polymerization Conditions | % Polymer Less than 10,000 $\overline{Mn}$ | $\overline{Mn}$ | $\overline{Mw}$ | Comments |
|---|---|---|---|---|---|---|---|
| | | | Ex. 5 in 1,2-dichloroethane (DCE) reflux 17 hrs, $N_2$ | | | | |
| 7 | (A)$_m$—(B)$_n$—(C—CH$_2$)$_p$ <br>                   CH$_3$ <br>                   CO$_2$R <br> (C) <br> R is CH$_3$ | 11:11:78 | 10% monomers, 0.1% nitrile of Ex. 5 in dioxane, $N_2$, 65° C., 6 hrs. | <15% ~72% has MWt 12,500–87,500 | 19,000 | 115,000 | Good positive image |
| 8 | Same as Ex. 7 | 10:8:82 | Same as Ex. 7 | ~20% ~60% has MWt 15,00–75,000 | 14,000 | 51,000 | Fair positive image; washout incomplete to base in spots |
| 9 | Same as Ex. 7 except R is n-butyl | 35:25:40 | 20% monomers, 0.2% nitrile of Ex. 5 in 1,2-DCE, $N_2$ reflux 16 hrs. | ~40% | 4,200 | 122,000 | Positive washout with fair to good speed. Coating brittle. |
| 10 | Same as Ex. 7 except R is isodecyl | 50:25:25 | Same as Ex. 9 | ~30% | 4,800 | 437,000 | Fair to good image |
| 11 | Same as Ex. 7 except R is n-hexyl | 25:25:50 | 10% monomers, 0.1% nitrile of Ex. 5 in 1,2-DCE, $N_2$ reflux 8 hrs. | ~27% ~50% has MWt 15,000–65,000 | 6,300 | 70,000 | Fair to good positive image. |
| 12* | (A)$_m$—(B)$_n$—(CH—CH$_2$)$_p$ <br>                   C=N <br> (C) | 66:33:1 | Same as Ex. 7 | — | — | — | Excellent positive image |

*50 mg polymer, 0.5 mg CI 109 red dye in 0.3 ml of a solution of 20 mg/ml tricresylphosphate/methylene chloride coated with a 0.002 inch (0.05 mm) doctor knife on an aluminum sheet (Anocoil ®).

EXAMPLE 13

A. Synthesis of 3'-Methoxybenzoin Acrylate

The procedure was analogous to Example 4A except that 3-methoxybenzaldehyde was used in place of 3,4-dimethoxybenzaldehyde. 6.6 g (22%) of polymer exhibiting the correct infrared and NMR spectra for 3'-methoxybenzoin acrylate monomer was obtained.

B. Synthesis of Copoly(3'-methoxybenzoinacrylate/2-acryloxyethyl phthalate)

The procedure described in Example 4B was employed except that the following ingredients were mixed, then reacted and polymer isolated and tested as described in Example 4B:

| Ingredients | Amount (g) |
|---|---|
| Monomer, Example 13A | 2.96 (10 mmole) |
| 2-Acryloxyethyl phthalate | 1.07 (4 mmole) |
| Azobisisobutyronitrile | 0.043.0 |
| Dioxane | 40.0 ml |

C. Formation of Positive Image

A coating formulation of the following composition was applied to an anodized aluminum sheet with a 0.002 inch (0.005 cm) doctor knife and air dried.

| Ingredients | Amount (mg) |
|---|---|
| Copolymer, Example 13B | 50.0 |
| CI 109 red dye | 0.5 |
| Tricresylphosphate/methylene chloride 20 mg/ml | 0.3 ml |

The element was exposed for 2 minutes through an image-bearing transparency to a black light blue radiation source described in Example 1E(1) and was developed for 15 seconds in the developer described in Example 4C. A good positive washout image was obtained.

EXAMPLE 14

A. Synthesis of 3,3'-Dimethoxybenzoin Acrylate

This monomer was made by two procedures.

One method utilized 3,3'-dimethoxybenzoin, 43% solution in benzene, (E. I. du Pont de Nemours and Company, Wilmington, Del.); the second utilized the same benzoin but the benzene was evaporated and the compound was redissolved in methylene chloride. The procedures and work-up were analogous to that of Example 1A(4) except for a minor variation in ingredients. The composition was:

| Ingredients | Amount (g) |
|---|---|
| 3,3'-Dimethoxybenzoin in benzene, 47.2% solids | 50 |
| Dimethylaniline | 17 ml |
| Acryloyl chloride | 10 ml |

The products obtained have infrared and NMR spectra consistent with the stated monomer.

B. Synthesis of Copoly(3,3'-dimethoxybenzoin acrylate/2-acryloxyethyl phthalate)

The following ingredients were mixed and treated as described in Example 4B:

| Ingredients | Amount (g) |
|---|---|
| Monomer, Example 14A | 3.0 |
| 2-Acryloxyethyl phthalate | 0.96 |
| Azobisisobutyronitrile | 0.035 |
| Dioxane | 40.0 ml |

C. Formation of Positive Image

A coating formulation of the following composition was whirl coated at 120 rpm on an anodized aluminum sheet (Anocoil ®) and was dried for 20 minutes at 100° F.

| Ingredients | Amount (mg) |
|---|---|
| Copolymer described in Example 14B above | 1000.0 |
| Xanthone | 100.0 |
| CI 109 red dye | 30.0 |
| N—methylpyrrolidone | 7.0 ml |

The element was exposed for 3 minutes through a transparency to a black light blue radiation source described in Example 1E(1) and was developed for 10 seconds in the developer described in Example 4C diluted 2 to 1 with water.

An excellent positive washout image was obtained.

EXAMPLE 15

This example illustrates the use of a co-binder in the photosensitive layer.

A coating solution of the following ingredients was prepared:

| Ingredients | Amount (mg) |
|---|---|
| Copolymer described in Example 6 | 50.0 |
| CI 109 red dye | 1.5 |
| Xanthone | 5.0 |
| Polyvinyl ethyl ether | 6.0 |
| Methylene chloride | 0.3 ml |

The above solution was applied to an aluminum sheet with a 0.001 inch (0.025 mm) doctor knife and dried at 47° C. for 20 minutes. The photosensitive layer was exposed through a 3√2 step wedge using the BLB exposure source described in Example 1E(1) and was developed for 30 seconds in a solution prepared from 0.5% NaOH, 10% ethylene glycol monobutyl ether, 89.5% water. A good positive wash-out image was obtained.

What is claimed is:

1. A photosensitive positive-working polymer consisting essentially of repeating units A, B and C wherein

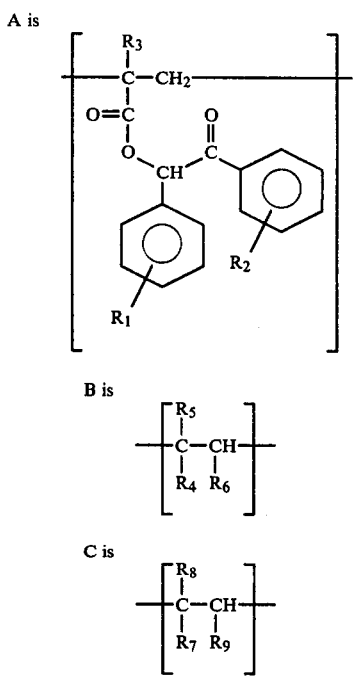

in the proportion mA, nB and pC
wherein
  m, n and p are the average integral frequencies of their respective monomeric constituents and have values in the range of 1 to 800, 0 to 800 and 0 to 800, respectively, with the proviso that the total of m, n and p ranges from 2 to 1600;
  $R_1$ is 3'-methoxy, 3',4'-dimethoxy or 3',5'-dimethoxy;
  $R_2$ is 3-methoxy, 3,4-dimethoxy, 3,4-benzo or hydrogen;
  $R_3$ is hydrogen or methyl;
  $R_4$ is COOH, $SO_3H$, omega carboxyalkyl of 1 to 4 carbon atoms or carboethoxy monophthalate, $\beta$-sulfocarboethoxy;
  $R_5$ is hydrogen or methyl;
  $R_6$ is hydrogen, methyl or COOH;
  $R_7$ is —CN, —$COOR_{10}$ where $R_{10}$ is alkyl of 1 to 10 carbon atoms, $\beta$-hydroxy alkyl where alkyl is of 1 to 4 carbon atoms;
  $R_8$ is hydrogen or methyl;
  $R_9$ is hydrogen or methyl.

2. A polymeric compound according to claim 1 wherein $R_1$ is 3',5'-dimethoxy; $R_2$, $R_3$, $R_5$ and $R_6$ are hydrogen, $R_4$ is carboethoxymono phthalate, m/n is 10 to 0.3 and p is 0.

3. A polymeric compound according to claim 1 wherein $R_1$ is 3',4'- dimethoxy; $R_2$, $R_3$, $R_5$ and $R_6$ each are hydrogen, $R_4$ is carboethoxymono phthalate, m/n is 10 to 0.3 with m and n ranging between 3 and 200 and 1 and 60, respectively, and p is 0.

4. A polymeric compound according to claim 1 wherein $R_1$ is 3',5'-dimethoxy; $R_2$, $R_3$ and $R_5$ each are hydrogen, $R_4$ is COOH, $R_6$ is $CH_3$, m/n is 10 to 0.3 and p is 0.

5. A compound according to claim 1 wherein said polymer is copoly(3',5'-dimethoxybenzoin acrylate/2-acryloxyethyl phthalate/acrylonitrile).

6. A compound according to claim 1 wherein said polymer is poly(3',5'-dimethoxybenzoin acrylate).

7. A compound according to claim 1 wherein said polymer is copoly(3',5'-dimethoxybenzoin acrylate/acrylic acid).

8. A compound according to claim 1 wherein said polymer is copoly(3,4-benzo-3',5'-dimethoxybenzoin acrylate/2-acryloxyethyl phthalate).

9. A compound according to claim 1 wherein said polymer is copoly(3',4'-dimethoxybenzoin acrylate/2-acryloxyethyl phthalate).

10. A compound according to claim 1 wherein said polymer is copoly(3'-methoxybenzoin acrylate/2-acryloxyethyl phthalate).

11. A compound according to claim 1 wherein said polymer is copolymer (3,3'-dimethoxybenzoin acrylate/2-acryloxyethyl phthalate).

12. A positive-working photosensitive element which comprises a support bearing a photosensitive layer consisting essentially of at least one polymeric compound according to claim 1 and optionally a sensitizer, a polymeric binder and/or a plasticizer.

13. A positive-working photosensitive element according to claim 12 wherein the photosensitive layer contains a xanthone compound.

14. A positive-working photosensitive element according to claim 12 wherein the photosensitive layer contains 0 to 25% by weight of plasticizer.

15. A positive-working photosensitive element according to claim 12 wherein the photosensitive layer contains 0 to 80% by weight of polymeric binder.

16. A positive-working photosensitive element according to claim 15 wherein the polymeric binder is taken from the group of polyepoxide resin, polyacrylate, polymethacrylate, phenol/formaldehyde resins, polyvinyl ethers and mixtures thereof.

17. A positive-working photosensitive element according to claim 12 wherein the support bearing the photosensitive layer has present thereon a layer of base soluble, carbon black.

* * * * *